United States Patent [19]

Hubbard

[11] Patent Number: 4,917,630
[45] Date of Patent: Apr. 17, 1990

[54] CONSTANT IMPEDANCE HIGH FREQUENCY COAXIAL CONNECTOR

[75] Inventor: George M. Hubbard, Hamden, Conn.

[73] Assignee: The Phoenix Company of Chicago, Inc., Wood Dale, Ill.

[21] Appl. No.: 273,693

[22] Filed: Nov. 21, 1988

Related U.S. Application Data

[63] Continuation of Ser. No. 108,783, Oct. 15, 1987, abandoned.

[51] Int. Cl.$^4$ ............................................. H01R 17/18
[52] U.S. Cl. ..................................... 439/578; 439/675
[58] Field of Search ................................ 439/578–585, 439/675, 607–610, 98, 99; 333/245, 246, 260, 261

[56] References Cited

U.S. PATENT DOCUMENTS

| | | | |
|---|---|---|---|
| 3,323,083 | 5/1967 | Ziegler | 439/578 |
| 3,437,960 | 4/1969 | Ziegler, Jr. | 333/33 |
| 3,486,161 | 12/1969 | Kraus et al. | 439/578 |
| 3,492,604 | 1/1970 | Fan | 333/33 |
| 3,761,844 | 9/1973 | Reeder | 333/33 |
| 3,828,303 | 8/1974 | Sladek et al. | 339/177 R |
| 3,828,304 | 8/1974 | Winn | 339/177 R |
| 3,852,700 | 12/1974 | Haws | 339/177 R |
| 4,035,054 | 7/1977 | Lattanzi | 339/177 R |
| 4,291,936 | 9/1981 | Oldfield et al. | 339/177 R |
| 4,358,174 | 11/1982 | Dreyer | 339/177 R |
| 4,374,606 | 2/1983 | Lathrop | 339/177 R |
| 4,426,127 | 1/1984 | Kubota | 339/177 R |
| 4,456,324 | 6/1984 | Staeger | 339/177 R |
| 4,531,790 | 7/1985 | Selvin | 439/607 |
| 4,561,716 | 12/1985 | Acke | 339/177 R |
| 4,653,840 | 3/1987 | Grabbe et al. | 339/177 R |
| 4,655,532 | 4/1987 | Hillis et al. | 439/607 |
| 4,664,467 | 5/1987 | Tengler et al. | 339/177 R |

FOREIGN PATENT DOCUMENTS

0669437 6/1979 U.S.S.R. ................................. 333/33

Primary Examiner—David Pirlot
Attorney, Agent, or Firm—DeLio & Associates

[57] ABSTRACT

A coaxial electrical connector, particularly suited for high frequency "blind-mate" connections, remotely located connections, multiple connector assemblies and quick connect/disconnect applications, having two mating plug halves, each plug having an inner conductor, an outer conductor and a dielectric spacer therebetween, the inner and outer conductor on each plug being of unequal lengths such that one projects beyond the other; the longer inner conductor from one plug and the longer outer conductor from the other plug being designed to overlap each other when the connector is first electrically connected and only partially engaged, thereby defining an overlap region; the inner and outer conductors being shaped and the dielectric material of the spacers being chosen such that along the axis of the partially engaged connector, particularly in the overlap region, the effective outer diameter of the inner conductor ("d") and the effective inner diameter of the outer conductor ("D") and the dielectric constant of the material therebetween ("E") satisfy the equation:

$$Z = 138 \, (E)^{-\frac{1}{2}} \log (D/d)$$

where Z is the impedance and is substantially constant along the length of the conductor as the plugs are moved from the first electrically connected, partially engaged position to the fully engaged position.

26 Claims, 3 Drawing Sheets

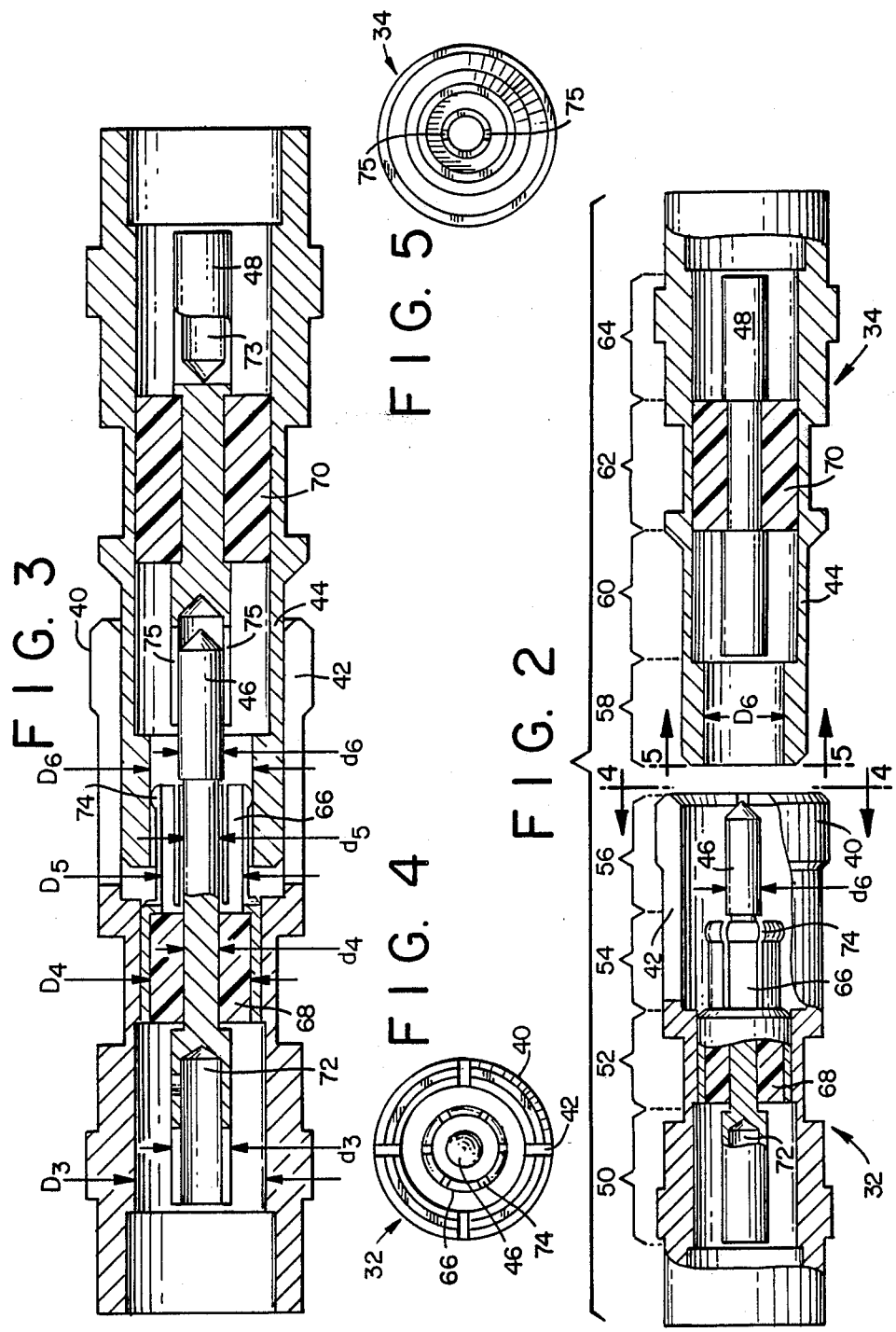

CONSTANT IMPEDANCE HIGH FREQUENCY COAXIAL CONNECTOR

This is a continuation of co-pending application Ser. No. 108,783 filed on October 15, 1987 now abandoned.

DESCRIPTION

1. Technical Field

This invention relates to coaxial electrical connectors, and more particularly to connectors for use in high frequency applications where the connector may not be fully engaged properly such as in quick connect/disconnect connectors and modular multiple connector assemblies for electrically connecting two modules together and simultaneously making multiple coaxial connections.

2. Background Art

Coaxial transmission lines and connectors for use therewith include generally cylindrical inner and outer conductors which are axially aligned and separated by a dielectric material. The dielectric within a cable is generally a flexible solid or foam which holds the inner conductor in the center of the cable and permits the cable to flex or bend as required. The dielectric material within a connector is generally a combination of a solid in one region of the connector to hold the conductors in alignment and air in another region.

A coaxial transmission line or connector as described above has a characteristic impedance determined by the outer diameter of the inner conductor (referenced by a lower case "d" herein), the inner diameter of the outer conductor (referenced by an upper case "D" herein) and the dielectric constant (referenced by the Greek letter epsilon "$\epsilon$" herein) of the material in the space between the two conductors which forms the signal pathway.

As is well-known, the characteristic impedance of a coaxial transmission line is determined by the formula:

$$Z = 138 \, (\epsilon)^{-\frac{1}{2}} \log (D/d)$$

where Z is the impedance of the line.

In order for a connector to minimize signal disruption as the signal passes through the connector, it must also have a characteristic impedance at each point along its length which matches the impedance of the transmission line as set by the formula above. An impedance mismatch causes severe signal disruption, particularly in high frequency applications above one (1) gigaHertz.

As described above, a high frequency coaxial connector will generally include at least some portion wherein the region between the inner and outer conductors is filled with air and another region wherein the space between the inner and outer conductors is filled with an insulating dielectric solid, such as teflon, to hold the inner conductor in coaxial alignment with the outer conductor. The dielectric constant of the teflon is different from that of air which may in turn be different from the insulating dielectric material used in the coaxial cable.

However, so long as the impedance as set forth by the formula above remains constant, signal disruption is minimized. Within the connector, this requires that the dimensions d and D be adjusted relative to each other at each point where the dielectric constant changes such that the impedance Z remains constant.

Substantially all prior art connectors have relied upon a butt joint between the two halves of the connector, i.e., between the male plug and the female plug at the intersection of both the inner and outer conductors to keep the diameters D and d constant at the transition point from one plug to the other. The phrase "butt joint" as used herein refers to a joint where two facing surfaces, one on the male plug and one on the female plug come together when the connectors are connected such that there is no gap between the two surfaces.

In such connectors, the dielectric constant $\epsilon$ is also generally the same on both sides of the transition point from the male to the female plug. The required condition of constant impedance along the length of the engaged connector is achieved by closing the gap between the plugs sufficiently that it can be ignored at the maximum frequency that the connector is designed to operate.

In a typical coaxial connector design, the outer conductor of the female plug is enlarged at its free end (thereby increasing D). This permits the outer conductor of the male plug to slide into the enlarged outer conductor of the female plug and make a butt joint (and a good mechanical and electrical connection) between the end of the male connector and the inside lip of the outer conductor on the female connector.

A similar arrangement occurs at the inner conductor where the free end of the inner conductor of the male plug usually has a reduced diameter (decreased d) which fits into an axial hole in the inner conductor of the female plug.

For a proper connection in such a prior art connector the plugs must be fully seated and there must be essentially no gap at the butted junctions between the inner and outer conductors of the male and female plugs. Only with the gap substantially closed can the increased D and decreased d of the outer and inner connectors be ignored. In such prior art connectors, even a relatively narrow gap, particularly at high frequencies, can substantially disrupt the signal as it passes through the connector by creating an impedance mismatch at the gap due to the uncontrolled variation of the diameters D and d in the gap required by the mechanical design constraints of the connector.

In order to close the gap in a butted connector, many high frequency connectors have relied upon screw threads on one plug and a threaded collar on the other plug which must be engaged and tightened to a specified torque to insure that the gap between the two connectors is reduced to a permissably small value.

Unfortunately, in many applications, it is not practical to obtain a torque wrench and fully seat each connector. Specific problems are encountered with multiple connectors and "blind-mate" or remotely located connectors or where quick connect operation is required. Where multiple connections must be made simultaneously one or more of the multiple connectors may not be fully seated even though the remaining connectors are properly positioned.

"Blind-mate" connectors are connectors used at the back end of a sliding module, for example, which makes all the necessary connections as the module slides into place. Such connectors are often "remotely located" in the sense that a fastener at the front of the module sets the location of the back of the module having one half of the connector, the other half being positioned on the frame in which the module is placed. Accordingly, the locating mechanism which determines the depth of insertion of one plug into the other is "remotely located" from the plugs themselves. Manufacturing tolerance variations or simple warps in the mounting frame all directly affect the gap between the two plugs.

To resolve these difficulties, coaxial connector designers have devised various methods to minimize the size of the gap. For example, U.S. Pat. No. 4,426,127 issued to Kubota shows a coaxial connector wherein the gap region between the male and female outer conductors as well as the gap region between the male and female inner conductors are filled by spring members which deform as the connection is made to minimize the size of the gap between the conductors over a small range of displacement between the two plugs.

However, this design still uses a butted type of connection wherein the critical diameters D and d are intended to remain constant at the transition point from the male to female plug. The spring mechanism is only effective over a very short distance of about 10 to 15 thousandths of an inch (0.25–0.38 mm). Unfortunately, gaps in excess of the range compensated by this design are quite common in the multiple connector and modular applications described above.

Accordingly, the present invention employs a novel design wherein the inner and outer conductors on the male and female plugs do not need to "butt" into each other. Instead, the conductors are designed to form an overlap region between the two plug halves which roughly corresponds to the gap in a prior art connector, the overlap region being intentionally designed so that it may form part of the signal pathway and have an impedance which matches the rest of the connector.

Accordingly, the connector has a constant impedance along its entire length from the moment its two halves are first electrically engaged, and the size of the "gap" or overlap region may be made as large as desired without affecting the impedance of the connector.

DISCLOSURE OF INVENTION

In accordance with the present invention, a connector is provided having a first plug for connection to a mating second plug. The first plug as shown in the drawings can be considered the male plug and the second plug can be considered to be the female plug, however, due to the design of the optional shield on the male plug which makes a female-type connection, the terms first and second plugs will be used to avoid confusion.

Each plug is provided with an inner conductor, an outer conductor and a dielectric spacer therebetween and in each, the inner and outer conductors are of unequal length at their free end such that one projects beyond the other. The inner and outer conductors of the first plug are designed to mate with the inner and outer conductors of the second plug.

The plugs are designed such that the longer inner conductor and the longer outer conductor from the first and second plugs overlap each other as the connector is first electrically connected and only partially engaged. This defines an overlap region between the inner conductor from one plug and the outer conductor from the other.

The inner and outer conductors are shaped, particularly in their relative diameters d and D, and the dielectric material of the spacers is chosen such that along the axis of the partially engaged connector, particularly within the overlap region, the effective outer diameter of the inner conductor (d) and the effective inner diameter of the outer conductor (D) and the dielectric constant of the medium therebetween ($\epsilon$) satisfy the equation:

$$Z = 138 \, (\epsilon)^{-\frac{1}{2}} \log (D/d)$$

where Z is the impedance and is substantially constant along the length of the connector as the plugs are moved from the first electrically connected, partially engaged position to the fully engaged position.

BRIEF DESCRIPTION OF THE DRAWINGS

The details of this invention will be described in connection with the accompanying drawings in which:

FIG. 2 is a side elevation, mostly in longitudinal section along the line 2—2 of FIG. 1.

FIG. 3 is a longitudinal section view of the connector showing the first and second plugs partially engaged.

FIGS. 4 and 5 are end views into the open mating ends, i.e. the "free" ends, of the connectors taken along the lines 4—4 and 5—5 marked in FIG. 2, respectively.

DETAILED DESCRIPTION OF THE INVENTION

1. Prior Art Connector

Figures 1, 6:
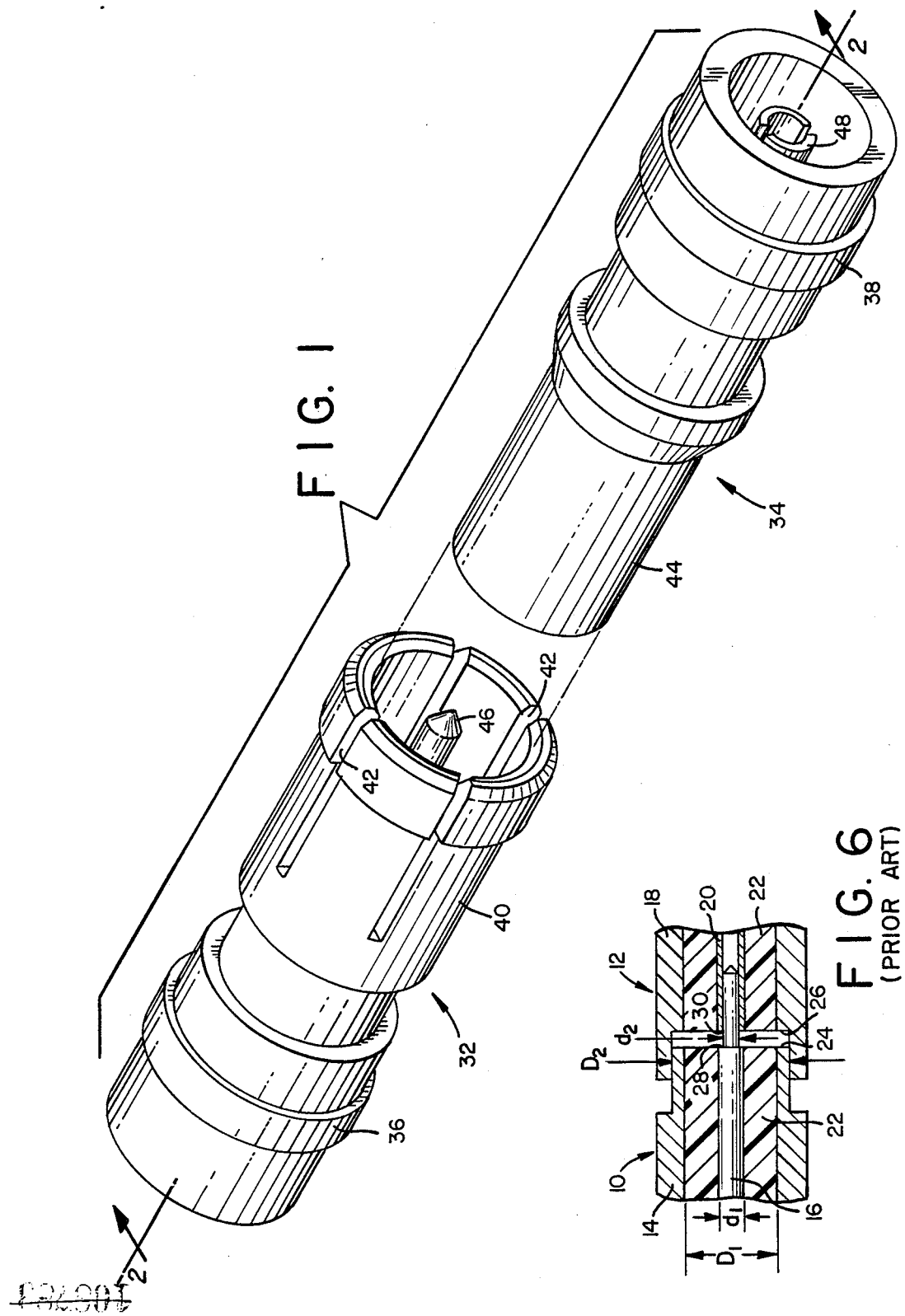
FIG. 1 is a perspective view of a connector according to the present invention. It should be noted that this view obscures several of the important characteristics of the invention which can be seen only in the longitudinal section views.
FIG. 6 is a longitudinal section view of a single prior art connector.

FIG. 6 shows a longitudinal section view of a simplified prior art connector. A discussion of this connector and the problems encountered when the connector is not fully seated will be helpful in understanding the present invention.

The prior art connector seen in FIG. 6 comprises a male plug 10 and a female plug 12. The male plug comprises an outer conductor 14 having an inner diameter $D_1$, and an inner conductor 16 having an outer diameter $d_1$ which is coaxially aligned with the outer conductor. The female plug 12 also includes an outer conductor 18 and an inner conductor 20 having the same critical diameters $D_1$ and $d_1$ in the major portion of its body as in the male plug.

The space between the inner and outer conductors is filled with a dielectric material 22 having a dielectric constant $\epsilon$. In this particular simplified example, the dielectric material is shown to extend throughout the interior of the plug, however in many connectors, only a portion of each plug is filled with the dielectric material; the remaining portions being open wherein the dielectric material is air.

In any event, the plugs shown in FIG. 6 are shown to be not fully engaged, having a small gap between the plugs. As described above, the characteristic impedance of the male plug is described by the formula:

$$Z = 138 \, (\epsilon)^{-\frac{1}{2}} \log (D_1/d_1)$$

This formula also describes the characteristic impedance of the female half of the connector 12, and accordingly if the plugs were fully seated, the male outer conductor 14 and the female outer conductor 18 would be butted together at faces 24, 26 as would the inner conductors 16 and 20 at faces 28, 30 thereby providing a constant impedance along the entire length of the connector.

However, as described above there are many applications wherein it is not possible to insure that the connector is fully seated and accordingly a gap develops as shown in FIG. 6. Within the gap region, the outer conductor 18 of the female plug has an enlarged inner diameter $D_2$. Similarly, the inner conductor 16 of the male plug has a reduced outer diameter $d_2$ as required to make the connections between the male 10 and female plugs 12.

Accordingly, within the gap region, the impedance of the connector is described by the formula:

$$Z_{gap} = 138 \, (\epsilon_{air})^{-\frac{1}{2}} \log (D_2/d_2).$$

For the situation shown in FIG. 6, all three critical parameters, $\epsilon$, D, d are different within the gap region as compared to their values within the transmission line and the remaining portions of the connector, and all three have been undesirably altered such that the impedance $Z_{gap}$ is increased. In particular, the dielectric constant of air ($\epsilon_{air}$) is generally less than that of the dielectric constant of most solid dielectrics which are commonly in use thereby increasing the factor $(\epsilon)^{-\frac{1}{2}}$. Moreover, the increased D and decreased d in the gap both act to increase the ratio $D_2/d_2$ thereby increasing the factor $\log (D_2/d_2)$ as compared to $\log (D_1/d_1)$. Consequently, all three factors act to increase the impedance $Z_{gap}$ thereby causing an impedance mismatch with resulting signal degradatin. Although in this simplified example all three parameters D, d and $\epsilon$ changed to cause the mismatch, a change in any single one of the parameters due to a gap would be sufficient to cause a problem at high frequencies.

Preferred Embodiment of the Connector

FIG. 1 shows a perspective view of the preferred embodiment of the connector. Many of the important features of the connector, however, are internal and are obscured by the exterior view seen in FIG. 1. Nonetheless, this figure is helpful for general orientation regarding the connector.

The connector is comprised of a first plug 32, and a second plug 34. The two plugs each have various enlarged rings 36, 38 around their circumference which are principally used to attach the individual plugs 32, 34 to a connector housing (not shown, but indicated generally in FIG. 7) for use in multiple connector modular assemblies.

The first plug includes a shield 40 with slots 42 which permits the shield 40 to be compressed slightly during manufacture thereby making firm electrical contact with the outer conductor 44 on the second plug 34 when the plugs are engaged.

Also visible on the first plug 32 is a portion of the free end of the inner conductor 46 of the first plug, the free end being the end which connects to the other plug.

Similarly, on the second plug 34 a portion of its inner conductor 48 can be seen. In this view, however, the visible end of the inner conductor 48 is the end for connection to the coaxial transmission line, not the free end. This end can have any standard configuration known to the art for making a connection to a coaxial transmission line. The end may be straight or right-angled and generally involves a soldered joint which makes a good low loss, substantially constant impedance connection between the coaxial transmission line and the second plug.

A similar connection is made between the far end (not visible in FIG. 1) of the first plug 32 and its respective coaxial transmission line.

FIG. 2 is a side elevational view of the connector along the line 2—2 seen in FIG. 1. This view is taken mostly in section in order to illustrate the important features of the invention. For purposes of description, first plug 32 can be divided into four regions marked with reference numerals 50–56 which correspond to four regions on the second plug 34 marked with reference numerals 58–64.

In the preferred embodiment, first plug 32 comprises four separate mechanical pieces, namely, the inner conductor 46, the outer conductor 66, the shield 40 and a dielectric spacer 68. The second plug 34 comprises three pieces including the inner conductor 48, the outer conductor 44 and the dielectric spacer 70.

Regions 50 and 64 in the first and second plugs respectively are the coaxial cable connection regions, i.e., the regions in which the signal first passes from the coaxial cable into or out of the connector. As indicated above, these regions are designed with standard techniques to mate with the specified coaxial cable and provide an exact impedance match such that the signal is transferred effectively to the first and second plugs respectively.

Generally, to make this connection, the outer conductor and the dielectric material of the coaxial cable are stripped back from the inner conductor of the coaxial cable. The inner conductor of the coaxial cable is inserted into the inner conductor 46 of the first plug 32 in the axial opening marked with reference numeral 72. A corresponding axial opening 73 is provided in inner conductor 48.

To the left of region 50 and to the right of region 64, the signal is passing in the pathway defined between the inner and outer conductors of the coaxial cable. Within regions 50 and 64, the signal is in the pathway defined between the shield 40 and the inner conductor 72 in the first plug 32, and between the outer conductor 44 and the inner conductor 48 in the second plug 34. The space between these regions is filled with air.

It will be understood that in first plug 32, the leftmost portion of shield 40 in region 50 acts as the outer conductor and defines the critical diameter D in that region. Reference to FIG. 3 shows that the critical diameter ratio $D_3/d_3$ defines the impedance of the connector in region 50 according to the formula:

$$Z = 138 \, (\epsilon_{air})^{-\frac{1}{2}} \log (D_3/d_3)$$

The diameters D and d in region 64 may be the same as in region 50, and must have the same ratio $D_3/d_3$ because the dielectric material is the same (air) in both regions. However, in the preferred embodiment, they are slightly different than $D_3$ and $d_3$, for simplified assembly of the final connector.

Regions 52 and 62 are the dielectric spacer regions wherein the space between the inner conductor and outer conductor on each plug is filled with a dielectric spacer. The dielectric spacer is preferably made of teflon, however, it may be of any of the many suitable dielectric materials which are well-known for use in high frequency connectors. The dielectric spacer holds the connector together, keeping the inner conductors axially aligned in the center of the outer conductors in each plug.

Because the dielectric constant of the preferred teflon is greater than the dielectric constant of air, the diameters $D_4, d_4$ in region 52 (see FIG. 3) must be adjusted to maintain the impedance within region 52 to match the impedance within region 50 and within the coaxial cable itself.

Accordingly, within region 52, the diameters $D_4$, $d_4$ are chosen such that:

$$(\epsilon_{teflon})^{-\frac{1}{2}}\log(D_4/d_4) = (\epsilon_{air})^{-\frac{1}{2}}\log(D_3/d_3)$$

This type of adjustment of the critical diameters D and d as the dielectric constant changes from one region to another is well-known. An important feature to note is that the transition from diameter $D_3$ to $D_4$ does not occur in exactly the same plane as the transition from $d_3$ to $d_4$ as one might expect.

This offsetting of the transitions of the inner and outer conductors is an empirically derived adjustment required because the impedance formula given above is completely accurate for the actual measured diameters D and d only in regions where the electric field lines are substantially radially aligned in the connector. This occurs only where the inner and outer diameters (d and D) are not changing rapidly. The formula does not give completely accurate results in regions where the diameters d and D are rapidly changing which causes the electric field lines to diverge from their radial alignment.

In the vicinity of a sharp corner on the surface of the inner or outer conductor, the electric field lines tend to point toward the corner and thus the "effective" internal and external diameters D,d differ slightly from the actual diameters which are measured radially.

Essentially, the "effective" diameters d,D when substituted into the formula above produce the actual impedance in the vicinity of a rapid change in the actual diameters D,d. The effective diameters, however, are quite close to the actual diameters even at the points of rapid transition of actual diameters. In regions where the actual diameter is unchanging, the effective diameter equals the actual measured diameter. It is the actual diameter which is generally used to calculate the impedance of the connector. However, it is the effective diameter which must be controlled even though most practitioners of the art of designing such connectors fail to distinguish the two.

The consequence of this is that in order to maintain a constant impedance through a region where the conductor diameters are changing, it is necessary to offset the diameter changes in the inner and outer conductors by a slight amount based upon the extent of the diameter change to be made. This requirement is well known to coaxial connector designers and represents a small adjustment to the idealized case where the two diameter changes would occur in the same plane. The adjustment may be easily estimated by those with experience in the field.

The regions marked with reference numerals 54 and 60 may be referred to herein as the "free space" regions. Within region 54, as within region 50, the relative diameters $D_5, d_5$ as indicated in FIG. 3 are selected once again to match the characteristic impedance of the remaining portions of the connector. As in region 50, the dielectric material between the inner conductor 46 and the outer conductor 66 is air and accordingly the ratio $D_5/d_5$ must be the same as the ratio $D_3/d_3$. It can be seen in FIG. 2 that the outer conductor 66 within region 54 has slots 74 which permit the free end of outer conductor 66 to be slightly enlarged thereby making electrical contact at its free end with the interior of the outer conductor of the second plug 44.

In region 56, the inner conductor of the first plug 46 projects beyond the outer conductor 66. As can be seen most clearly in FIG. 3, the projecting end of the inner conductor 46 in region 56 is enlarged in region 56, having an outer diameter $d_6$ which is greater than its diameter $d_5$ in region 54. As can be seen clearly in FIG. 2, the inner conductor 66 stops short of region 56. The outer shield conductor 40 does not form part of the signal passageway when the connector is connected. Accordingly, the projecting portion of the inner conductor 46 in region 56, having a diameter $d_6$, has as its corresponding outer conductor, the outer conductor 44 on the second plug in region 58 which has an inner diameter $D_6$ as marked in FIG. 2.

Referring to the second plug in FIG. 2, the operational similarity of the second plug to the first plug can be seen. Considering now a signal passing from the right side of FIG. 2 towards the left, the signal would enter the connector from the coaxial cable as previously described, entering regions 64, passing into region 62 and then into region 60, each of the regions described, 60–64 having the same characteristic impedance as the coaxial cable and as the corresponding regions 50–54 in the first plug.

Just as in the first plug, the inner and outer conductors 48, 44 in the second plug are of unequal lengths. In the second plug, the longer conductor is the outer conductor 44 which projects beyond the inner conductor 48 in region 58. Once again, in the projection region 58, as in region 56, the projecting member, which for the second plug is the outer conductor 44, has a change of its critical diameter as it goes from the free-space region 60 to the region 58. For the outer conductor 44, the critical diameter is its inner diameter D which changes to the reduced diameter $D_6$ in region 58 as compared to the corresponding larger inner diameter D in region 60.

In the preferred embodiment, regions 54, 56, 58 and 60 all have substantially the same length and, accordingly, as the connectors are engaged, the outer conductor 44 on the second plug in region 58 slides into the interior of the shield 40 on the first plug until the two outer conductors 66 and 44 contact each other. At approximately this point, the inner conductors 46 and 48 also make contact and the connectors form the electrical connection.

From the instant the electrical connection is formed, the connector has an overlap region defined by the overlap between regions 56 and 58. Within this region, the enlarged projecting portion of the inner conductor 46 and the reduced projecting portion of the outer conductor 44 form a transitional signal pathway between the two plugs having a characteristic impedance defined by the ratio $D_6/d_6$. These diameters are chosen to provide a matching impedance to the impedance elsewhere in the connector, and it is this match which is essential to producing a constant impedance along the length of the connector, even when the connector is only partially engaged.

As the connectors slide from the "just-barely" engaged position to the fully engaged position, the overlap region between regions 56 and 58 diminishes in size as the outer conductor 44 slides over the outer conductor 66 and ceases to function as part of the signal pathway. Similarly, the projecting end of inner conductor 46 slides into the inner conductor 48 and also ceases to function as part of the signal pathway.

It can be clearly seen that the length of the overlapping connectors can be made as great as desired to provide any desired tolerance for the connector. In the preferred embodiment, regions 54, 56, 58 and 60 are all approximately 0.10 inches (2.5 mm) in length which is more than sufficient for compensating for the variations in the depth of engagement of the two plugs which might occur in any of the applications previously discussed. The preferred length of regions 54, 56, 58 and 60 all provide a compensation which is about 10 times greater than prior art compensating designs.

Because the overlap region is designed to form part of the signal pathway with a matching impedance to the rest of the connector, it is not necessary that the connector be fully engaged. It is perfectly suitable for the connector to be used in applications where it might always be partially engaged.

It can be seen in FIGS. 3 and 5 that the free end of inner conductor 48 may be provided with slots 75. The end may then be lightly compressed to make electrical contact with the free end of inner conductor 46. All of the slots, seen best in FIGS. 4 and 5, and the compression or expansion of the slotted members are optional and may be adjusted as desired to suit the application.

The various components of the connectors are manufactured, the conductive components usually being plated with a highly conductive non-oxidizing material such as gold, and then assembled. The dielectric spacers 68, 70 may be held in position by adhesive or by lightly crimping or indenting the exterior of the outer conductors.

Connectors according to the invention work quite well at frequencies above 1 gigaHertz and have been tested to at least 18 gigaHertz.

Figure 7:
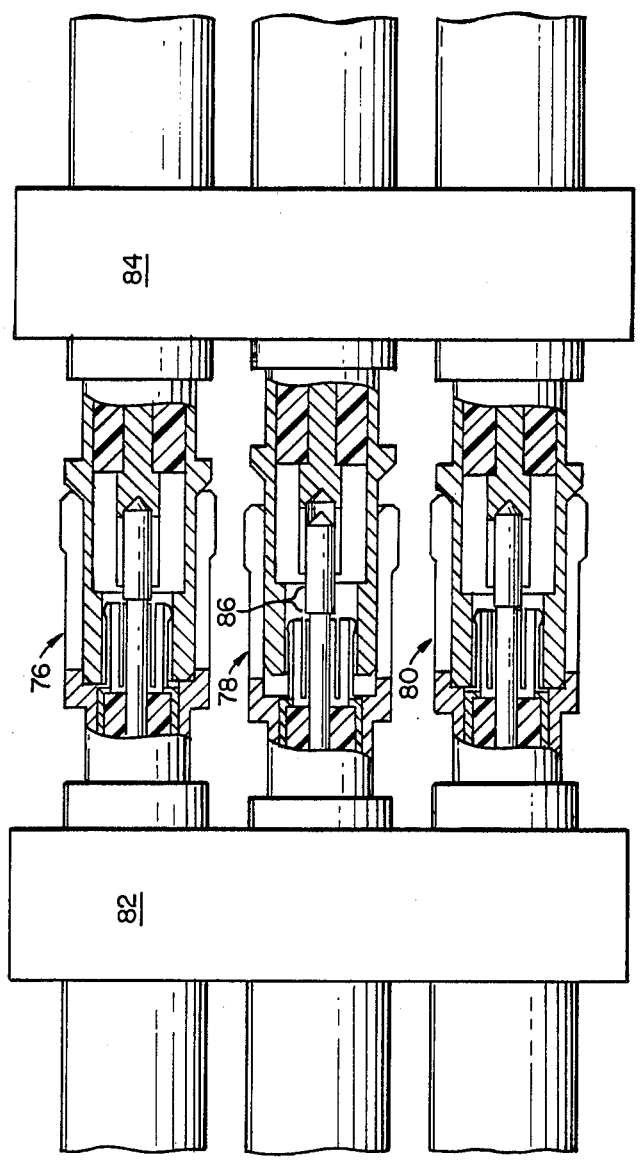
FIG. 7 is a longitudinal section view of a three connector block using the connector of the present invention showing one of the connectors being not fully engaged.

FIG. 7 shows a plurality of the connectors of the present invention identified with reference numerals 76, 78, 80. The first plugs of each connector are mounted in a connector block 82 and the second plugs are mounted in connector block 84. Typically, connector block 82 would be mounted to the back of an electrical module and connector block 84 would be mounted to the rear of a frame into which the electrical module would slide such that the connectors would mate when the module was positioned within the frame.

As can be seen in FIG. 7, connectors 76 and 80 are fully seated whereas connector 78 is shown to be only partially seated due to some misalignment or manufacturing variation.

Accordingly, the region marked with reference numeral 86 would, in a prior art connector, be a gap causing an impedance mismatch through connector 78, however in the present connector this is the overlap region which is designed to form part of the signal pathway and which includes a characteristic impedance which matches the impedance elsewhere in the connectors and transmission line.

I claim:

1. A coaxial electrical connector comprising:
   a first plug comprising an inner conductor, an outer conductor and a dielectric spacer therebetween, the first plug having a free end for connection to a second plug, the inner and outer conductors of the first plug also having free ends, one of the free ends of the inner and outer conductors of the first plug projecting beyond the free end of the other conductor; and
   a second plug comprising an inner conductor, an outer conductor and a dielectric spacer therebetween, the second plug having a free end for connection to the first plug, the inner and outer conductors of the second plug also having free ends for connection to the free ends of the inner and outer conductors of the first plug, one of the inner and outer conductors of the second plug projecting beyond the free end of the other conductor;
   wherein the free end of the projecting conductor of the first plug and the free end of the projecting conductor of the second plug overlap each other when the connector is first electrically connected and only partially engaged thereby defining an overlap region; and
   wherein the inner and outer conductors are shaped and the dielectric material of the spacers is chosen such that along the axis of the partially engaged connector, including in the overlap region, the effective outer diameter of the inner conductor referenced by "d", the effective inner diameter of the outer conductor referenced by "D" and the dielectric constant of the medium therebetween referenced by "$\epsilon$" satisfy the equation:

$$Z = 138 \, (\epsilon)^{-\frac{1}{2}} \log (D/d)$$

where Z is the impedance and the impedance is substantially the same in the overlap region as in the first and second plugs when the connector is in the partially engaged position.

2. An electrical connector according to claim 1 wherein the dielectric spacers are formed of teflon.

3. An electrical connector according to claim 1 wherein the overlap region forms part of the signal pathway even with the connector fully engaged.

4. An electrical connector according to claim 1 wherein the free end of the inner conductor of the first plug projects beyond the free end of the outer conductor of the first plug and the free end of the outer conductor of the second plug projects beyond the free end of the inner conductor of the second plug; the free end of the inner conductor of the first plug having a larger diameter in the region where it projects beyond the outer conductor of the first plug than in the region where it does not project beyond the outer conductor of the first plug; and, the outer conductor of the second plug having a smaller inner diameter in the region where it projects beyond the inner conductor of the second plug than in the region where it does not project beyond the inner conductor of the second plug.

5. An electrical connector according to claim 4 wherein the outer conductor of the first plug is slotted and slightly expanded at its free end to make connection to the interior of the outer conductor of the second plug.

6. An electrical connector according to claim 4 wherein the inner conductor of the second plug is slotted and slightly compressed at its free end to make connection to the inner conductor of the first plug.

7. An electrical connector according to claim 4 wherein the length of the enlarged projecting portion of the inner conductor of the first plug is substantially the same as the length of the projecting portion of the outer conductor of the second plug.

8. An electrical connector according to claim 1 further including an electrically conductive shield substantially surrounding the free end of the first plug and formed to mate with and substantially surround the free end of the outer conductor of the second plug when the plugs are engaged.

9. An electrical connector according to claim 8 wherein the shield is slotted and slightly compressed at its free end to make connection with the exterior of the second plug.

10. A plurality of electrical connectors according to claim 1 wherein at least one of the plugs of each connector is mounted in a connector block.

11. A plurality of electrical connectors according to claim 10 wherein both plugs of each connector are mounted in opposing connector blocks whereby all the connectors may be disconnected and connected substantially simultaneously.

12. A coaxial electrical connector comprising:
a first plug including:
   a first inner conductor having a free end for connection to a second inner conductor;
   a first outer conductor having a free end for connection to a second outer conductor; and
   a first dielectric spacer between the first inner conductor and the first outer conductor, the free end of the first inner conductor projecting beyond the free end of the first outer conductor, the region between the first inner conductor and the first outer conductor having a substantially constant impedance;
a second plug for connection to the first plug including:
   the second inner conductor having a free end for connection to the first inner conductor;
   the second outer conductor having a free end for connection to the first outer conductor; and
   a second dielectric spacer between the second inner conductor and the second outer conductor, the free end of the second outer conductor projecting beyond the free end of the second inner conductor, the region between the second inner conductor and the second outer conductor having a substantially constant impedance;
   the projecting portion of the first inner conductor and the projecting portion of the second outer conductor overlapping each other when the connector is partially engaged thereby defining an overlap region which forms part of the signal pathway; and
   the ratio of the inner diameter of the projecting portion of the second outer conductor to the outer diameter of the projecting portion of the first inner conductor and the dielectric constant within the overlap region being such that the impedance is substantially constant within the overlap region and is the same as the impedance of the connector in the first and second plugs.

13. A coaxial electrical connector according to claim 12 wherein the length of the projecting portion of the first inner conductor is substantially the same as the length of the projecting portion of the second outer conductor.

14. A coaxial electrical connector according to claim 12 wherein the first and second dielectric spacers are formed of teflon.

15. A coaxial electric connector according to claim 12 wherein the overlap region forms part of the signal pathway when the connector is fully engaged as well as when the connector is only partially engaged.

16. A coaxial electrical connector according to claim 12 wherein the projecting portion of the first inner conductor has an outer diameter larger than the outer diameter of the non-projecting portion of the first inner conductor and the projecting portion of the second outer conductor has an inner diameter which is smaller than the inner diameter of the non-projecting portion of the second outer conductor.

17. A coaxial electrical connector according to claim 16 wherein the first outer conductor slides inside and contacts the projecting portion of the second outer conductor.

18. A coaxial electrical connector according to claim 17 wherein the first outer conductor is slotted and slightly expanded at its free end to make connection to the interior of the free end of the second outer conductor.

19. A coaxial electrical connector according to claim 16 wherein the projecting portion of the first inner conductor slides inside and contacts the second inner conductor.

20. A coaxial electrical connector according to claim 19 wherein the free end of the second inner conductor is slotted and slightly compressed at its free end to make connection to the exterior of the free end of the first inner conductor.

21. A coaxial electrical connector according to claim 12 further including an electrically conductive shield substantially surrounding the projecting portion of the first inner conductor and formed to mate with the exterior of the free end of the second outer conductor when the plugs are engaged.

22. A coaxial electrical connector according to claim 21 wherein the shield is slotted and slightly compressed at its free end to make connection with the exterior of the free end of the second outer conductor.

23. A plurality of coaxial electrical connectors according to claim 12 wherein at least one of the plugs of each connector is mounted in a connector block.

24. A plurality of coaxial electric connectors according to claim 23 wherein the first and second plugs of each connector are mounted in opposite connector blocks whereby all the connectors may be disconnected and connected substantially simultaneously.

25. A coaxial electrical connector comprising:
a first plug including coaxially mounted first inner and first outer conductors;
   the first outer conductor having an inner diameter $D_{first}$;
   the first inner conductor having a portion which projects beyond the first outer conductor, the projecting portion having an outer diameter $d_{overlap}$ and the non-projecting portion having an outer diameter $d_{first}$;
a second plug including coaxially mounted second inner and second outer conductors:
   the second inner conductor having an outer diameter $d_{second}$;
   the second outer conductor having a portion which projects beyond the second inner conductor, the projecting portion having an inner diameter $D_{overlap}$ and the non-projecting portion having an inner diameter $D_{second}$;
   the projecting portions of the first inner and second outer conductors overlapping each other when the connector is partially engaged thereby defining an overlap region; and the diameter ratios:

$$\frac{D_{first}}{d_{first}}, \frac{D_{second}}{d_{second}} \text{ and } \frac{D_{overlap}}{d_{overlap}}$$

all being substantially equal.

26. A coaxial electrical connector according to claim 25 wherein $d_{first}$ is smaller than $d_{overlap}$ which is smaller than $d_{second}$ and wherein $D_{first}$ is smaller than $D_{overlap}$ which is smaller than $D_{second}$.

* * * * *

UNITED STATES PATENT AND TRADEMARK OFFICE
CERTIFICATE OF CORRECTION

PATENT NO. : 4,917,630

DATED : April 17, 1990

INVENTOR(S) : George M. Hubbard

It is certified that error appears in the above-identified patent and that said Letters Patent is hereby corrected as shown below:

ON THE TITLE PAGE, ITEM [57]:

In Line 20, above the equation, and in the equation, change the symbol for the dielectric constant from "E" to -- $\epsilon$ --.

In column 5, line 32, please delete "degradatin" and substitute therefor --degradation--.

Signed and Sealed this

Eleventh Day of June, 1991

*Attest:*

HARRY F. MANBECK, JR.

*Attesting Officer*   *Commissioner of Patents and Trademarks*